United States Patent
Navon et al.

(10) Patent No.: US 9,483,339 B2
(45) Date of Patent: Nov. 1, 2016

(54) SYSTEMS AND METHODS FOR FAST BIT ERROR RATE ESTIMATION

(71) Applicant: SanDisk Technologies Inc., Plano, TX (US)

(72) Inventors: Ariel Navon, Revava (IL); Eran Sharon, Rishon Lezion (IL)

(73) Assignee: SanDisk Technologies LLC, Plano, TX (US)

( * ) Notice: Subject to any disclaimer, the term of this patent is extended or adjusted under 35 U.S.C. 154(b) by 117 days.

(21) Appl. No.: 14/318,310

(22) Filed: Jun. 27, 2014

(65) Prior Publication Data

US 2015/0378801 A1    Dec. 31, 2015

(51) Int. Cl.
| | |
|---|---|
| H04L 1/00 | (2006.01) |
| G06F 11/07 | (2006.01) |
| G06F 11/10 | (2006.01) |
| G06F 12/02 | (2006.01) |
| G11C 16/34 | (2006.01) |
| G11C 11/56 | (2006.01) |

(52) U.S. Cl.
CPC ......... *G06F 11/076* (2013.01); *G06F 11/1004* (2013.01); *G06F 11/1068* (2013.01); *G06F 12/0246* (2013.01); *G11C 11/5628* (2013.01); *G11C 16/3459* (2013.01); *G06F 2212/1032* (2013.01); *G06F 2212/7207* (2013.01)

(58) Field of Classification Search
CPC .................................................... H04L 1/0045
USPC ....................................... 714/746, 733, 718
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 2013/0107628 A1 | 5/2013 | Dong et al. | |
| 2013/0220088 A1 | 8/2013 | Horn et al. | |
| 2013/0229846 A1 | 9/2013 | Chien et al. | |
| 2014/0043897 A1 | 2/2014 | Pan et al. | |
| 2014/0043898 A1 | 2/2014 | Kuo et al. | |
| 2015/0121157 A1* | 4/2015 | Raghu | G11C 29/82 714/723 |
| 2015/0348649 A1* | 12/2015 | Yang | G11C 29/44 714/723 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner* — Fritz Alphonse
(74) *Attorney, Agent, or Firm* — Davis Wright Tremaine LLP

(57) ABSTRACT

Changes in the distribution of memory cells across memory states allow calculation of Bit Error Rate (BER). Comparison of test data stored in memory and a known good copy of the test data provides test data BER from which user data BER may be obtained. Data may be handled differently according to its BER.

31 Claims, 14 Drawing Sheets

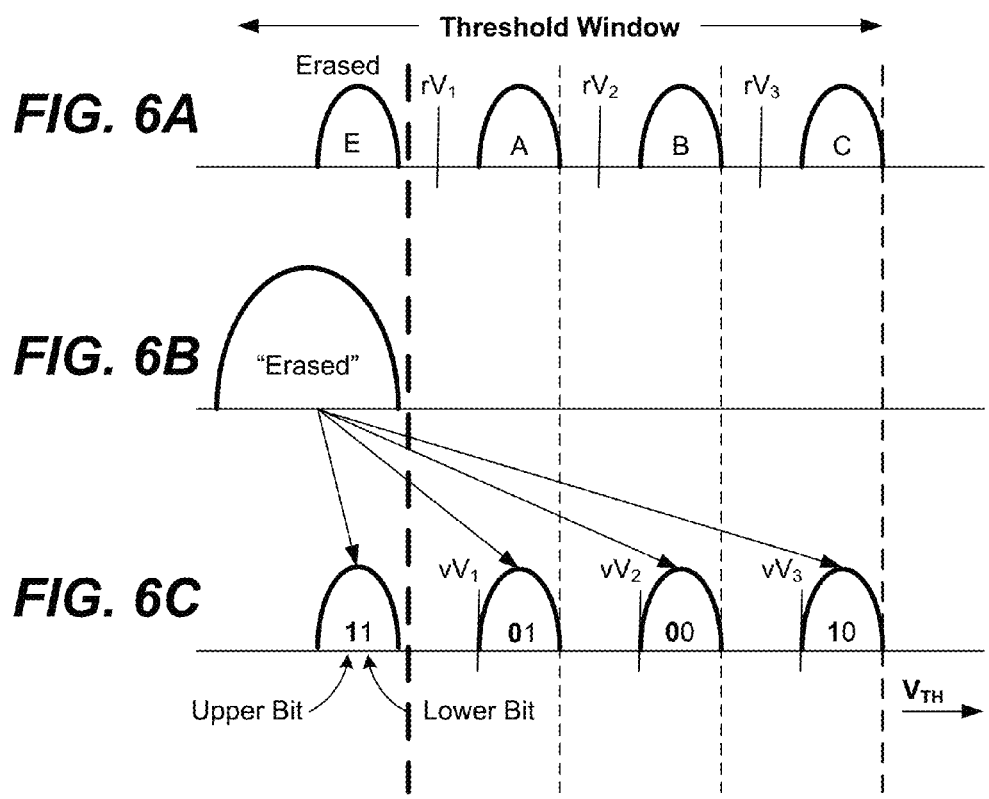
Programming into four states represented by a 2-bit code

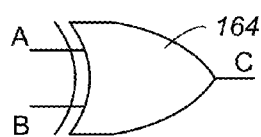
FIG. 13A
| A | B | C |
|---|---|---|
| 0 | 0 | 0 |
| 1 | 0 | 1 |
| 0 | 1 | 1 |
| 1 | 1 | 0 |
FIG. 13B
| Test | 1 0 1 0 1 0 1 0 |
| Read | 1 0 1 1 1 0 1 0 |
| XOR  | 0 0 0 1 0 0 0 0 |
FIG. 13C
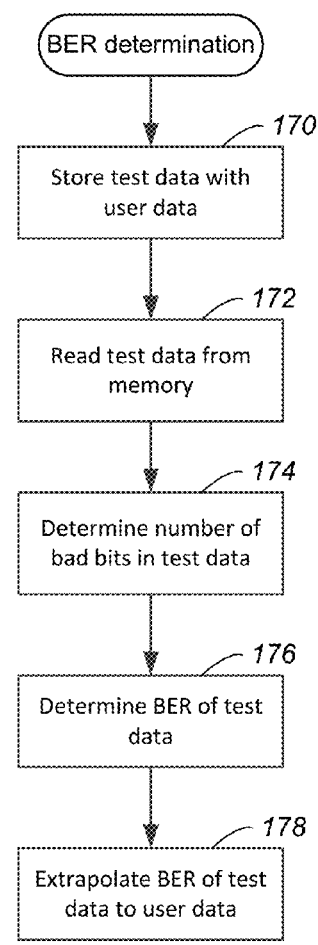
FIG. 14

SYSTEMS AND METHODS FOR FAST BIT ERROR RATE ESTIMATION

BACKGROUND

This application relates to the operation of re-programmable nonvolatile memory systems including semiconductor flash memory systems and resistive memory systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In addition to flash memory, other forms of nonvolatile memory may be used in nonvolatile memory systems. For example Ferroelectric RAM (FeRAM, or FRAM) uses a ferroelectric layer to record data bits by applying an electric field that orients the atoms in a particular area with an orientation that indicates whether a "1" or a "0" is stored. Magnetoresistive RAM (MRAM) uses magnetic storage elements to store data bits. Phase-Change memory (PCME, or PRAM) such as Ovonic Unified Memory (OUM) uses phase changes in certain materials to record data bits. Resistive RAM (ReRAM) uses changes in electrical resistance of certain materials to record data. Various other nonvolatile memories are also in use or proposed for use in nonvolatile memory systems.

In many nonvolatile memory systems errors occur in data that is read out from the memory after storage. Such errors may be detected and corrected by Error Correction Codes (ECC). However, ECC correction may require significant time and resources.

SUMMARY OF THE INVENTION

Bit Error Rate (BER) for data stored in a memory may be rapidly estimated and used to select appropriate handling schemes for the data. In an example, the distribution or shape of data (e.g. the number or fraction of cells in logic 0 or logic 1 states) is recorded at the time the data is stored. Subsequently, when the data is read, the shape of the read data is obtained and compared with the original shape. The difference in shape may be used to estimate the BER. In another example, test data is written and subsequently read from the memory. The read test data is compared with good test data to determine the BER of the read test data. The BER of the test data is then extrapolated to user data.

The BER may give an indication of the health of the data which can be useful in a number of ways. The BER may be used to determine how data is copied. For example, if the BER is low then data may be copied on-chip without performing error correction. If the BER is high then the data may be sent for error correction (e.g. to memory controller). The BER may be used when reading data. If data is read with a low BER then the data may be sent to a memory controller for ECC correction. If the BER is high then the data may be reread using modified read parameters until acceptable data is obtained. The BER may be used when determining whether to refresh the data ("Read-Scrub" operation). If the BER of a portion of data is above a threshold then it may be refreshed. If the BER is below the threshold then it may be maintained without refresh.

An example of a method of determining an error rate for data stored in a nonvolatile memory array includes: programming a population of memory cells to a plurality of states; recording an indicator of the number of the memory cells programmed to a first state of the plurality of states; subsequently performing a read operation to determine the number of the memory cells that are read as being in the first state; determining a difference between the number of the memory cells programmed to the first state and the number of the memory cells that are read as being in the first state; and calculating the error rate for data in the population of memory cells from the difference.

An additional indicator of the number of the memory cells programmed to a second state of the plurality of states may be recorded. Prior to programming the population of memory cells to the plurality of states, raw data may be shaped so that the data stored in the nonvolatile memory array is distributed across the plurality of states in a distribution that is different to the raw data. The error rate may be calculated using a probability of memory cell transitions from the first state to at least one other state, and a probability of memory cell transitions from the at least one other state to the first state. The indicator may be one of: the number of the memory cells programmed to the first state; the number of the memory cells not programmed to the first state; the fraction of the memory cells programmed to the first state; or the fraction of the memory cells not programmed to the first state. An appropriate manner of handling the data in the population of memory cells may be selected according to the calculated error rate. The selecting may include selecting on-chip copying of the data without need of Error Correction Code (ECC) correction involvement when the calculated error rate is below a predetermined threshold. The selecting may include selecting an appropriate ECC scheme, or no ECC scheme, according to the calculated error rate. Several types of ECC engines (such as LDPC-based controllers) support several modes of decoding, and a reliable indication to the BER level might help the decoder. For example, an indication of a high BER may result in selection of an advanced ECC decoding mode, which may use more power and/or require more time. This may allow appropriate ECC decoding of data with different BERs so that relatively good data is decoded rapidly and efficiently, and more advanced ECC decoding is used sparingly for relatively bad (noisy but still correctable) data. The selecting may include also selecting an alternative to ECC correction of the data when the calculated error rate indicates that the data is uncorrectable using ECC. The alternative may include updating the reading thresholds, and might also include rereading the data using a modified reading scheme. The modified reading scheme may be a high resolution reading scheme that provides higher resolution than the read operation (e.g. "Soft-Bits" read). The selecting may include updating a data management table to reflect the status of the data based on the bit error rate. The selecting may include selecting a fast read scheme for the data and adjacent data in response to determining that the bit error rate is below a predetermined rate. Selecting an appropriate manner of handling the data may include determining whether to perform data refresh (a.k.a. data scrub) operation on the data. The calculating may be performed by circuits on the same memory chip as the nonvolatile memory array.

An example of a method of determining an error rate for data that is read from a nonvolatile memory array includes: programming a sample population of memory cells with test data; subsequently reading the sample population of memory cells to obtain read data; comparing the read data and the test data to identify a number of bad bits in the read data; calculating a bit error rate for the sample population from the number of bad bits in the sample population; and extrapolating the calculated bit error rate to user data stored in memory cells outside the sample population.

The sample population of memory cells may consist of a number of memory cells that is fewer than the number of memory cells that are read when performing a read of user data, and the reading of the sample population of memory cells may be performed more rapidly than a read of user data. An appropriate ECC decoding scheme, or no ECC decoding scheme, may be selected for the user data according to the extrapolated bit error rate. On-chip copy without ECC correction may be selected when the user data is to be copied to another location in the nonvolatile memory array and the extrapolated bit error rate is below a predetermined threshold. An alternative to ECC decoding, such as a modified read scheme, may be selected when the extrapolated bit error rate indicates that the data is uncorrectable by ECC. The data obtained from the alternative approach may subsequently be sent for ECC correction. The alternative may include rereading the data using modified read parameters. A determination may be made as to whether to perform data refresh or data scrub operations on the user data based on the extrapolated bit error rate.

An example of a memory integrated circuit includes; an array of memory cells formed on a substrate; and an error rate calculation circuit on the substrate, the error rate calculation circuit configured to receive a portion of data that is read from the array of memory cells and perform an error rate calculation on the portion of data read from the array of memory cells.

The array of memory cells may be a monolithic three dimensional memory array formed in a plurality of memory device levels vertically disposed above the substrate. The array of memory cells may be an array of Resistive Random Access Memory (ReRAM) cells. On-chip copy circuits may be configured to copy the portion of data from a first location in the array of memory cells to a second location in the array of memory cells without transferring the portion of data outside the memory integrated circuit if the portion of data has a calculated error rate that is below a threshold. The error rate calculation circuit may include an Exclusive OR (XOR) circuit for identifying bad bits in the portion of data that is read from the array of memory cells by performing an XOR operation with a good copy of the portion of data. The error rate calculation circuit may include a scan circuit for counting the number of bits in a particular state in the portion of data that is read from the array of memory cells.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of memory cells.

FIG. 13A shows an XOR gate.

FIG. 13B shows an XOR gate truth table.

FIG. 13C illustrates XORing of good test data and read test data.

FIG. 14 illustrates an example of BER determination using test data.

DETAILED DESCRIPTION

Memory System

Figure 1:
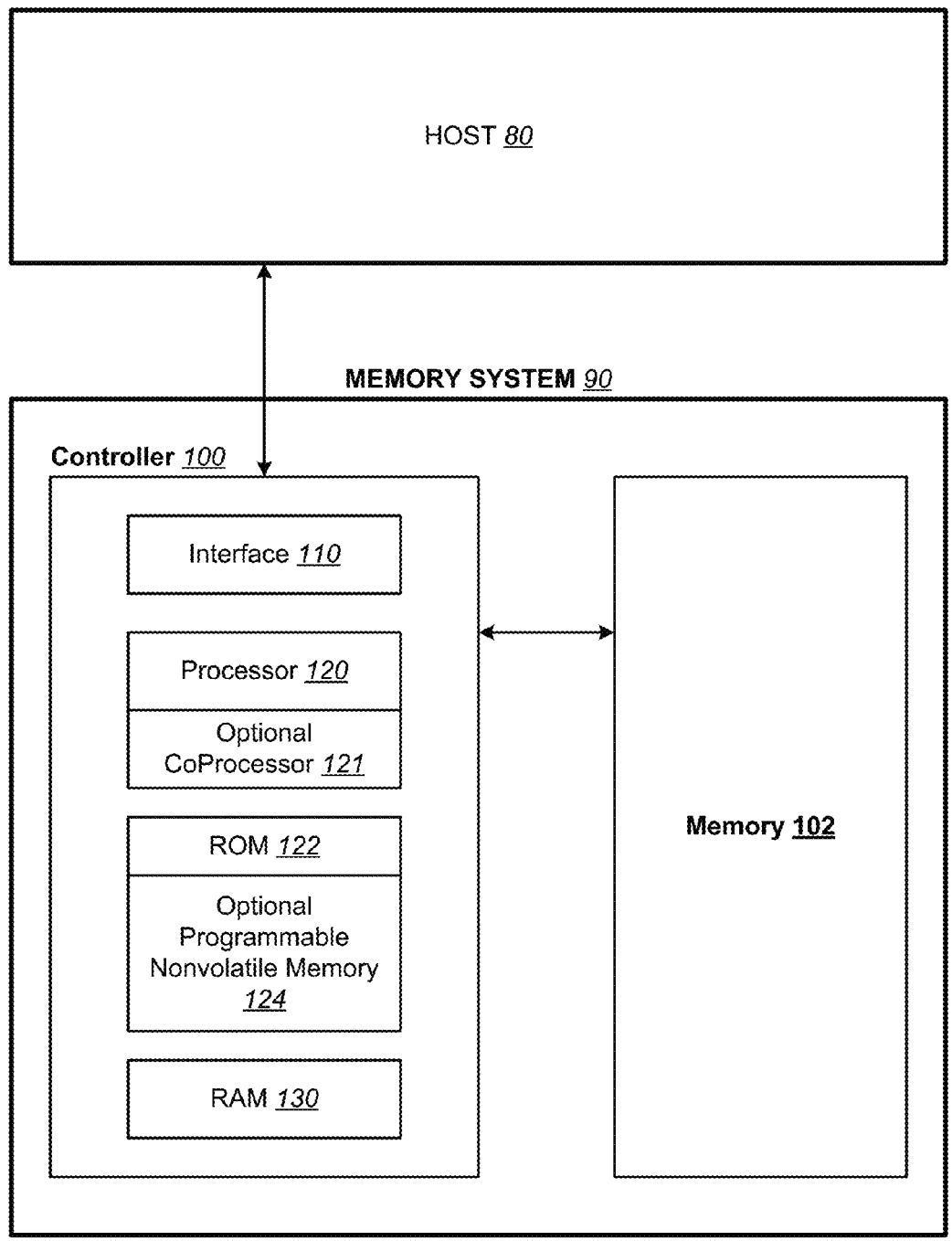
FIG. 1 illustrates schematically the main hardware components of a memory system suitable for implementing the present invention.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Physical Memory Structure

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Figure 2:
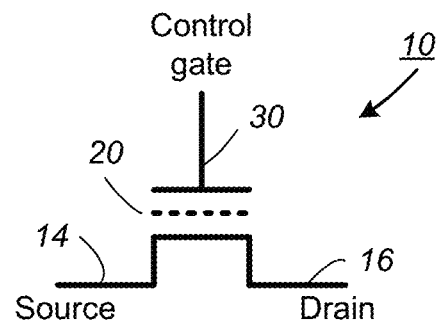
FIG. 2 illustrates schematically a non-volatile memory cell.

FIG. 2 illustrates schematically a non-volatile charge storage memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
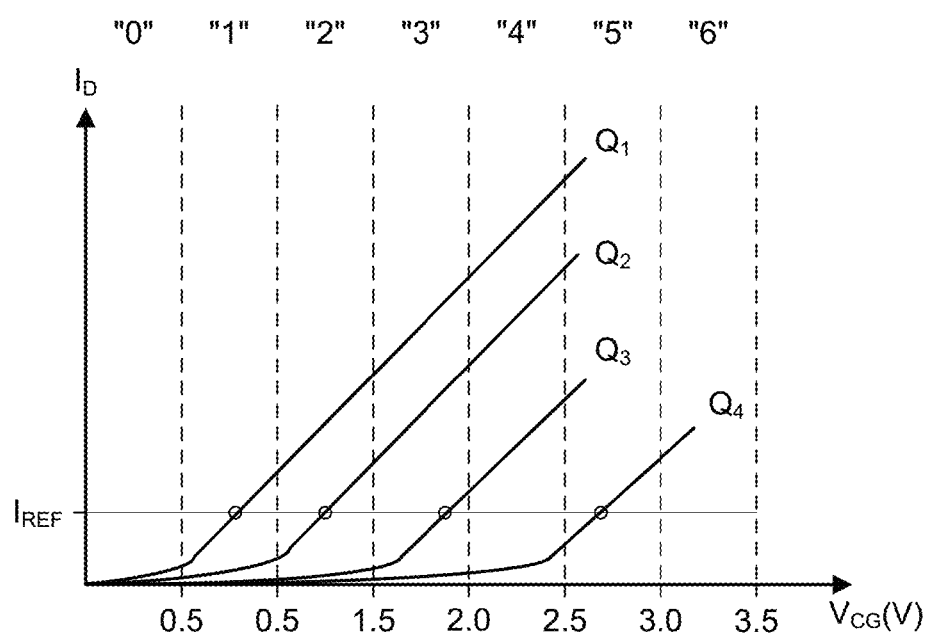
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, TREE of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
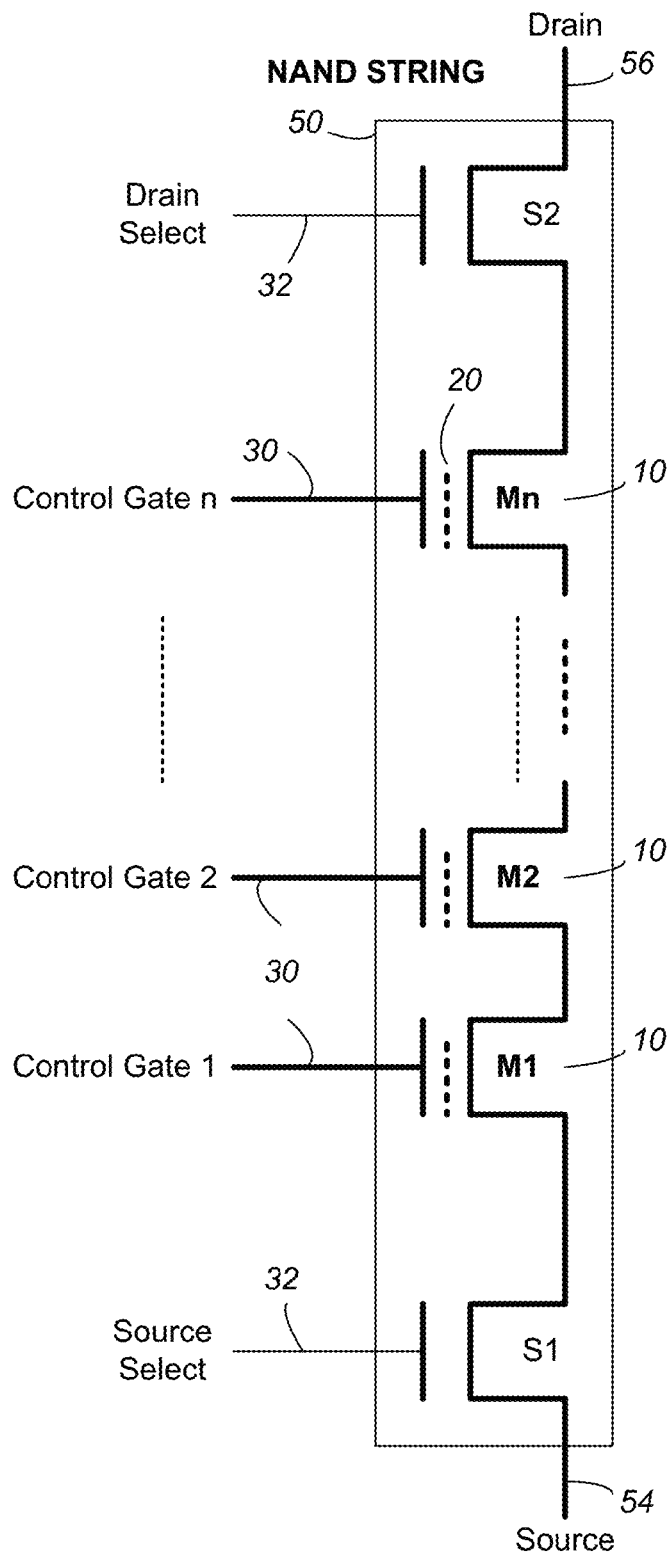
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
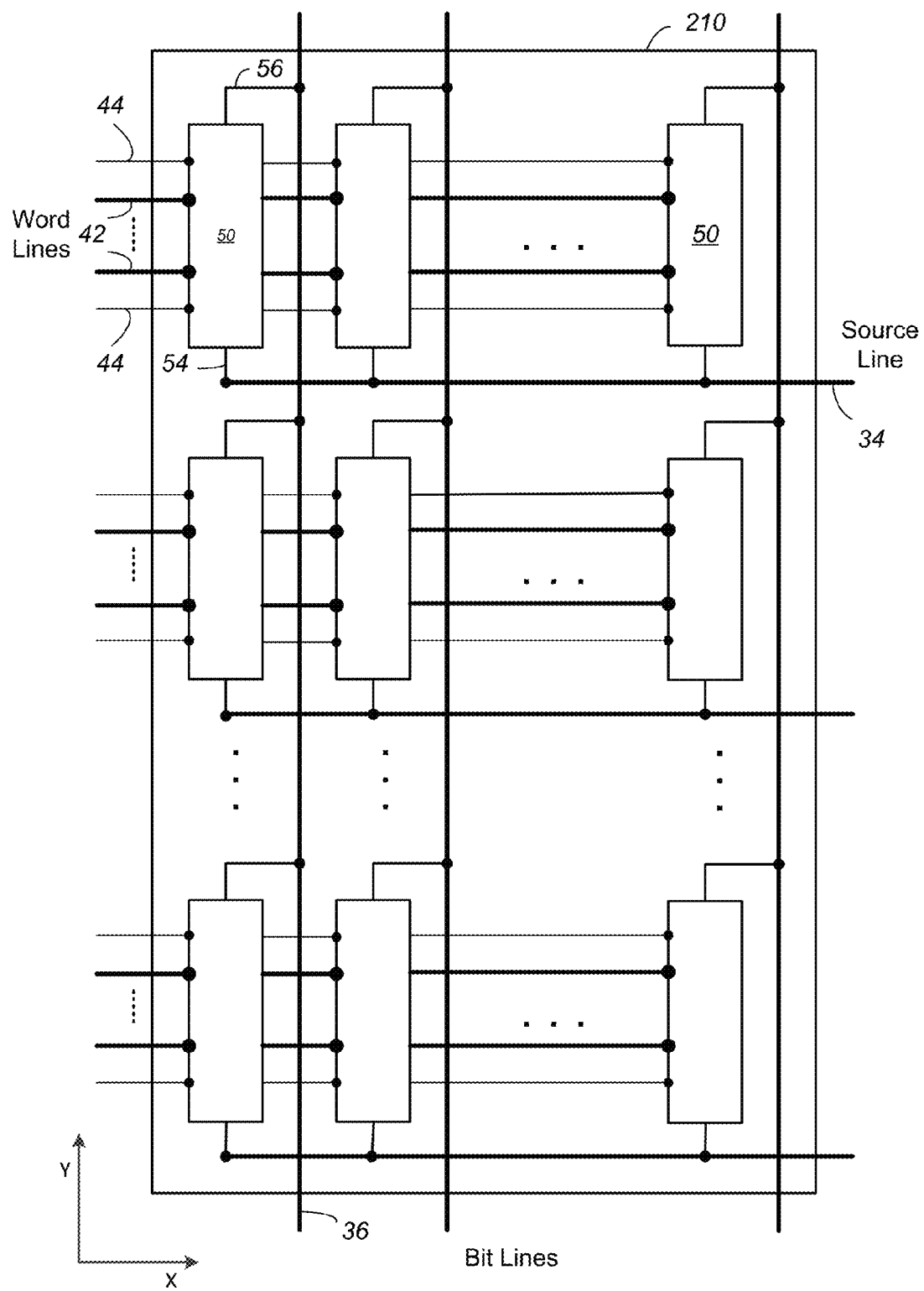
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
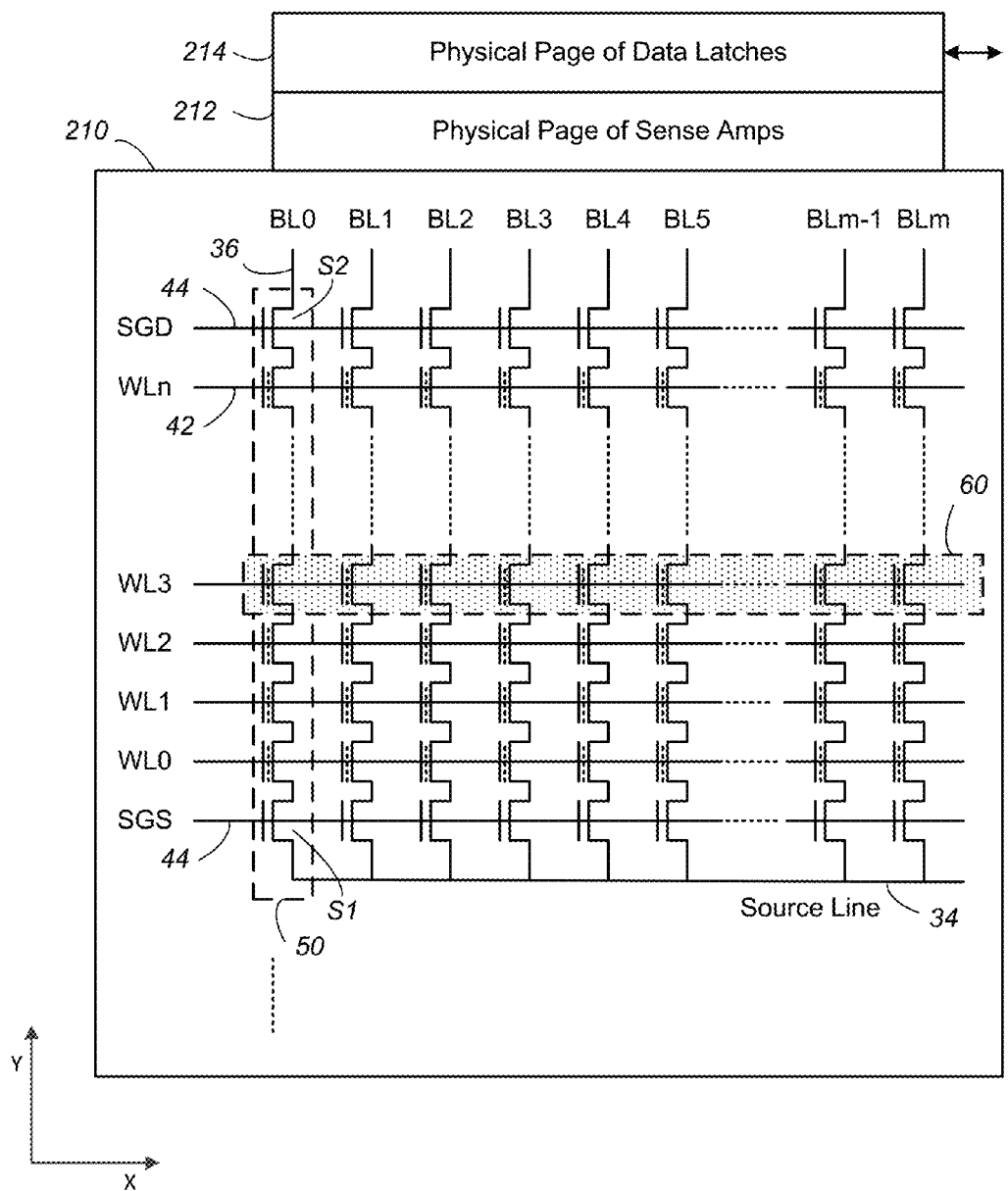
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". (The vertical axis represents the number of memory cells.) FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain unprogrammed in the "erased" state. As the memory gets more programming, the initial distribution of the "erased" state as shown in FIG. 6B will become narrower and the erased state is represented by the "E" state.

A 2-bit code having a lower bit and an upper bit can be used to represent each of the four memory states. For example, the "E", "A", "B" and "C" states are respectively represented by "11", "01", "00" and '10'. The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S.

Patent Publication Number 2013/0107628, which are hereby incorporated by reference in their entirety.

Figure 7:
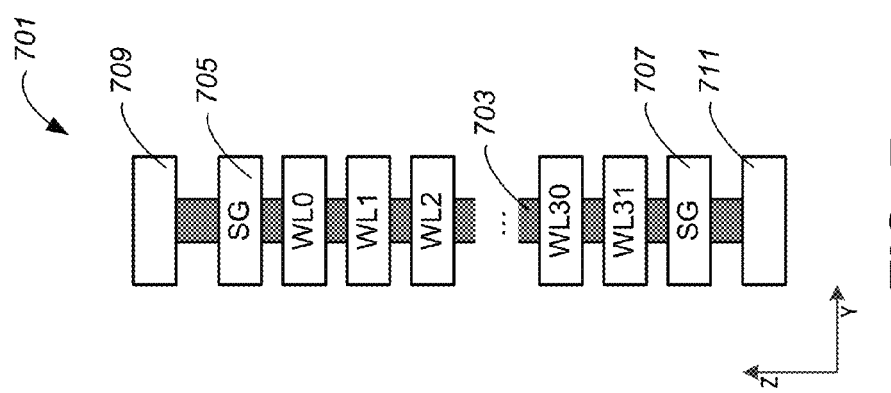
FIG. 7 shows an example of a physical structure of a 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
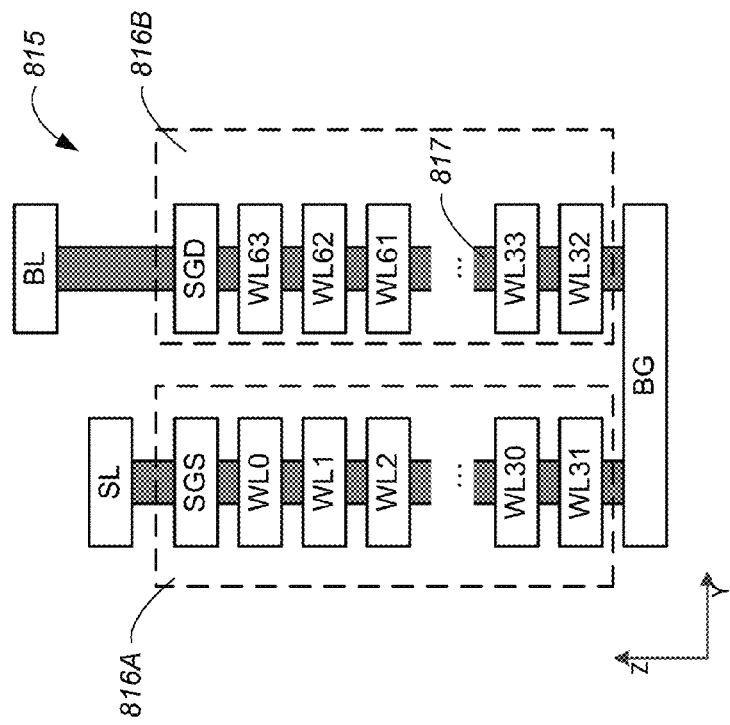
FIG. 8 shows an example of a physical structure of a U-shaped 3-D NAND string.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SOD, are located at either end of NAND string 815 to control connection/isolation of NAND string 815.

Figure 9:
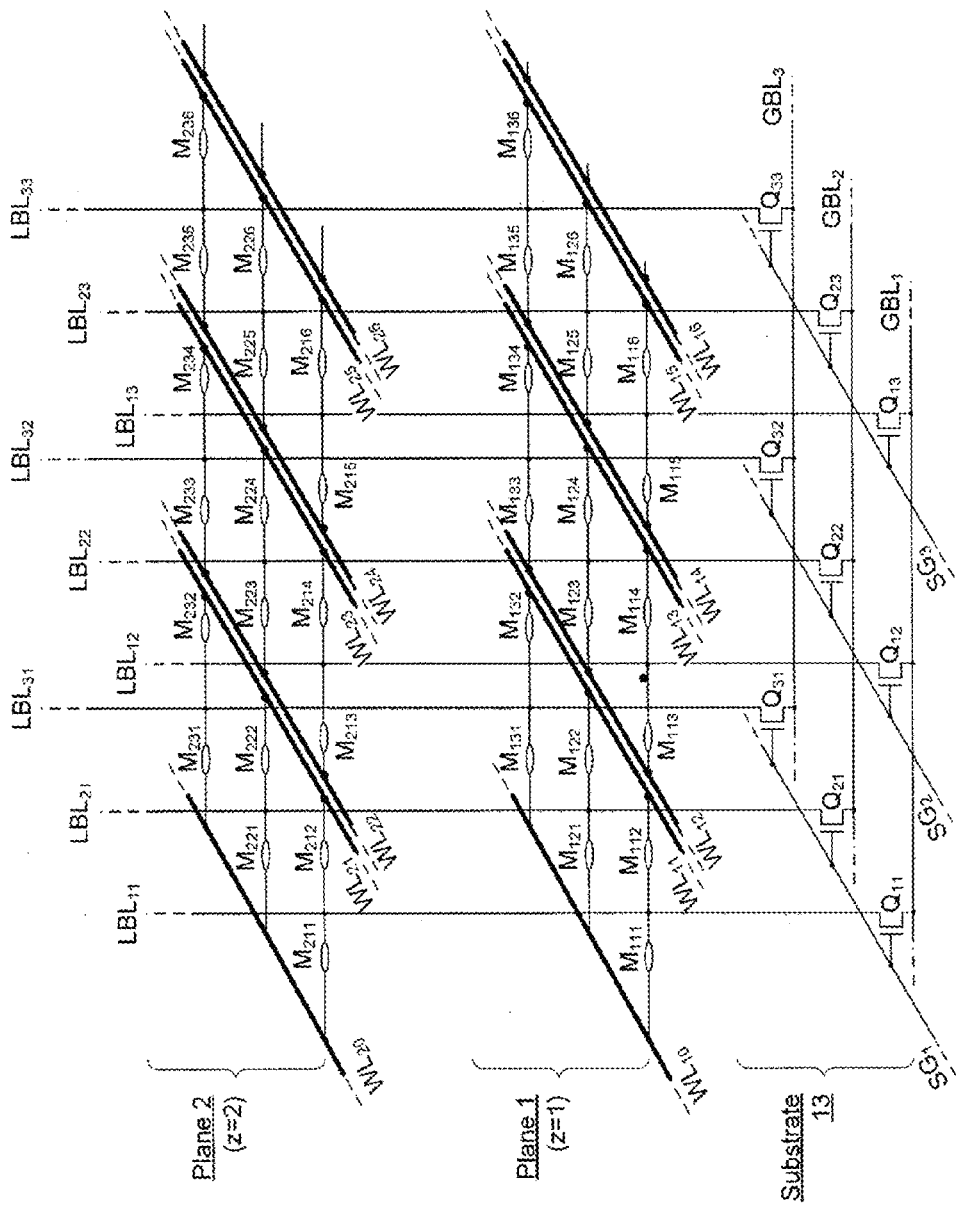
FIG. 9. shows an example of a 3-D ReRAM memory

FIG. 9 shows an example of a three dimensional memory (ReRAM) in which memory elements are formed by resistive elements. Global bit lines ($GBL_1$-$GBL_3$) extend horizontally in the substrate with select transistors connecting global bit lines to local bit lines ($LBL_{11}$-$LBL_{33}$). Memory cells are formed in horizontal planes that extend above the substrate. Word lines in each plane connect to resistive elements of the plane with the opposite ends of the resistive elements connected to local bit lines. Word lines extend in pairs in this example (e.g. $WL_{11}$ and $WL_{12}$). In other examples word lines connect to resistive elements on either side and are not paired. Examples of three dimensional ReRAM memory systems are described in U.S. Patent Publication Number 20130229846 by Chien et al.

While particular examples of two dimensional and three dimensional memory design are described above, it will be understood that aspects of the present invention are applicable to a wide range of memories and are not limited to the examples described above (i.e. not limited to charge storage, or resistive memories, or limited to SLC or MLC, or to particular hardware).

Bit Error Rate (BER)

In general, data is stored in memory cells by placing memory cells in conditions that are mapped to logical states. For example, threshold voltage of a charge storage memory cell such as a floating gate transistor may be mapped into two or more ranges that correspond to different logical states. Electrical resistance of a resistive element may be similarly mapped to two or more ranges that correspond to different logic states. In nonvolatile memories, memory cells retain their programmed condition for an extended period of time without further intervention. However, some change generally occurs over time for a variety of reasons so that data may not be read exactly as it was programmed. Some bits may be flipped (i.e. some cells that were programmed with a logic 0 are read as logic 1 and some cells programmed with a logic 1 are read as logic 0). The number of such flipped bits (bad bits) in a given portion of data may be expressed as the Bit Error Rate ("BER") which may be expressed as a fraction, ratio, percentage, or other suitable format.

The BER gives an indication of the condition or health of the data, which may be used in various ways. Data that is read from a memory may be handled differently depending on the BER of the data. For example, different approaches to correcting the data may be used depending on the BER. Data with a low BER may be corrected by a simple ECC decoding scheme prior to being sent to a host (or may be copied to another location within the memory without any correction). Data with a higher BER may require a different ECC correction scheme. Data with a high BER may be uncorrectable by ECC and may require some other form of correction or recovery. While ECC may be used to obtain BER, ECC decoding may take significant time and resources to determine BER for a portion of data and ECC correction is generally performed in a controller or other IC that is separate from the memory IC so that data transfer is required. Aspects of the present invention are directed to fast and efficient ways to obtain an indication of BER which may then be used to make decisions as to how the data should be handled (including whether ECC decoding should be applied, and if so what sort of ECC decoding).

Figure 10A:
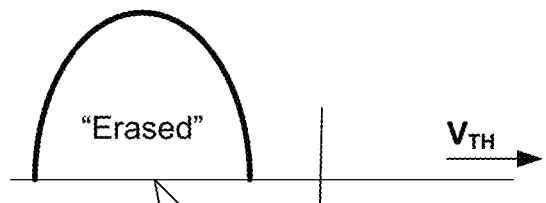
FIGS. 10A-10E shows how a population of memory cells may develop errors.
Figure 10B:
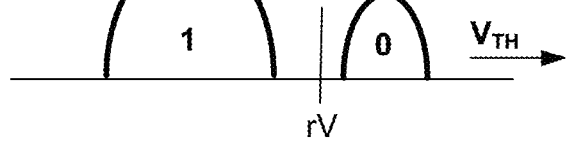
Figure 10C:
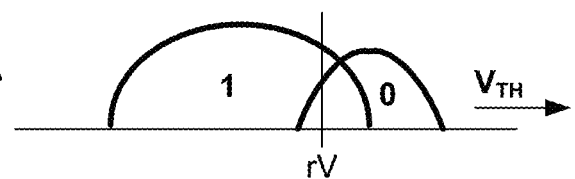

FIGS. 10A-10C illustrate data that is programmed and subsequently read from a charge storage SLC memory. FIG. 10A shows a population of memory cells that are in the erased state prior to programming. FIG. 10A shows threshold voltage $V_{TH}$ along the horizontal axis and the number of cells along the vertical axis. Subsequently, as shown in FIG. 10B, the memory cells are programmed so that threshold voltages of some memory cells are increased to a range that corresponds to a logic state 0 while threshold voltages of other memory cells remain substantially unchanged in a range that corresponds to a logic state 1 (mapping of logic states to threshold voltage ranges may also be the opposite with logic 1 corresponding to programmed cells and logic 0 corresponding to unprogrammed cells). Subsequently, as shown in FIG. 10C, threshold voltages of memory cells may change because of charge leakage, disturbance from other memory access operations (e.g. because of programming of other data, or reading operations), physical defects, or other reasons. These distributions may cause some bad bits when the data is read. For example, the distribution of memory cells programmed to logic 0 extends below the read voltage rV so that these cells are misread as logic 1. Similarly, the distribution of memory cells programmed to logic 1 extends above rV so that these cells are misread as logic 0.

Figure 10D:
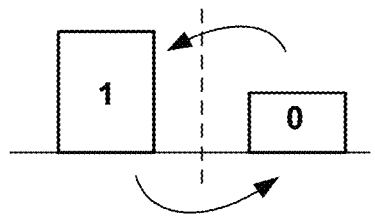
Figure 10E:
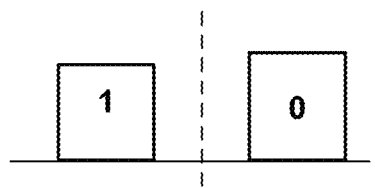

FIGS. 10D-10E illustrate bit flipping more generally for two-state memories (including resistive memories, or memories using other physical characteristics to store data). After data is programmed, some cells flip from logic 0 to logic 1 and some flip from logic 1 to logic 0. This may result in a change in the overall distribution or shape of the memory cells as shown by FIG. 10E. While FIG. 10D shows more logic 1 cells than logic 0 cells, FIG. 10E shows more logic 0 cells than logic 1 cells. According to an example, a change in overall distribution or shape may be detected and used to provide an indication of BER. An indication of the shape may be recorded at the time of writing the data in the memory. Subsequently, when the data is read, the shape of the read data is again determined and is compared with the recorded shape. Any difference between these shapes may be used to estimate the BER. Thus, in the simple example of FIGS. 10D-10E, the initial shape might be recorded as a number, a fraction, or percentage of cells in the logic 1 state (e.g. 700, 0.7, or 70% for a population of 1000 cells) while the shape of the read data would be a different number, fraction, or percentage (e.g. 400, 0.4, or 40%). Such a change may be used to estimate the BER.

While the examples here are largely directed to SLC memory for simplicity of illustration, it will be understood that the profile or shape of a population of programmed memory cells in an MLC memory may be similarly identified and recorded. For example, in an MLC memory that stores two bits of data per cell using four states (e.g. E, A, B, C, as shown in FIG. 6A), the fraction of memory cells in each state, or a subset of the four states, may be recorded for subsequent comparison with corresponding fractions in read data.

Estimation of BER from shape information may be performed in any suitable manner depending on the nature of the data and the memory cells. Some data may not have a normal distribution of logic states but instead may be have an asymmetric distribution that is skewed towards particular logic states. This may occur randomly or because of a deliberate shaping operation that is implemented to achieve a particular shape to improve memory operation. For example, data in ReRAM may be shaped to favor higher resistance states. In some memories, memory cells may flip symmetrically (i.e. equal numbers of cells flip from 0 to 1 and from 1 to 0) while in other memories memory cells may flip asymmetrically. Such characteristics may be factored in when calculating BER.

For example, shaped data may be 80% logic 1 (20% logic 0) at the time when the data is written. Subsequently, the read data may be 78% logic 1 (22% logic 0). This may be expressed as:

$$P_{zero\text{-}at\text{-}prog}=0.2, P_{zero\text{-}at\text{-}read}=0.22$$

The number of zeroes read is the original number of zeroes minus the number of cells that flipped from zero to one, plus the number of cells that have flipped from one to zero. Assuming that the probability of flipping ("Prob") is symmetric, this may be expressed as:

$$P_{zero\text{-}at\text{-}read}=P_{zero\text{-}at\text{-}prog}*(1-\text{Prob})+(1-P_{zero\text{-}at\text{-}prod})*\text{Prob}$$

Substituting in the numbers above gives:

$$0.22=0.2*(1-\text{Prob})+(0.8)*\text{Prob}$$

Solving for Prob gives:

$$\text{Prob}=0.033, \text{ or } 3.3\%$$

Thus, the change in shape from 20% to 22% zeroes corresponds to a probability of flipping of 3.3% and a BER of 3.3%. This estimation has a standard deviation of approximately:

$$\text{Sqrt}(n*\text{Prob}*(1-\text{Prob}))/n=0.002, \text{ or } 0.2\% \text{ where } n \text{ is the number of cells.}$$

Figures 11, 12:
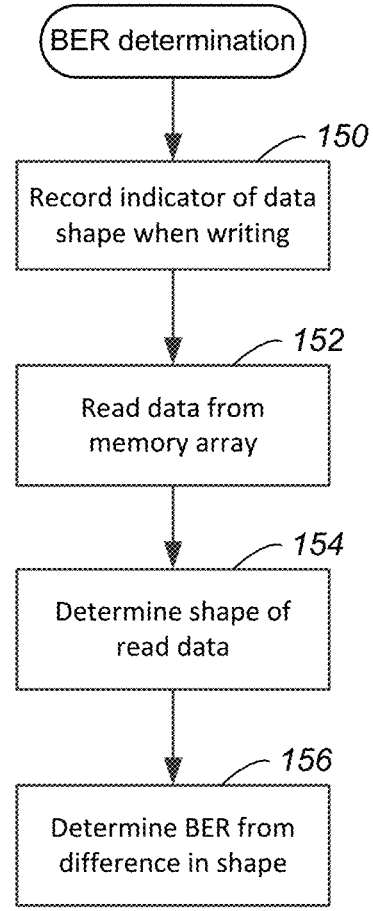
FIG. 11 illustrates an example of how BER may be determined.
FIG. 12 shows comparison of good test data and read test data to identify bad bits.

FIG. 11 illustrates a scheme for determining BER from shape information. An indicator of data shape is recorded 150 when the data is written. Subsequently, when the data is read from the memory 152, the shape of the read data is determined 154. The difference between the shape of the written data and the shape of the read data may then be used to determine the BER 156.

Shape data may be obtained in a fairly simple manner. For example, data that is held in a row of latches may be subject to a bit scan operation in which the number of latches in a particular state (e.g. logic 1) are counted. This can be done prior to programming a portion of data and the result can be stored. When the data is read another bit scan is performed to count the number of cells in the particular state. Any change can be used to determine the BER of the data.

BER estimation from changes in data shape may not be suitable for all situations. For example, if data is not shaped prior to storage and is more randomized (e.g. SLC memory cells approximately 50% zeroes) and flipping is symmetric, then the number of bits flipped in each direction will be equal so that the shape of the data remains the same regardless of the number of bits flipped.

Data Comparison

According to another example of BER estimation, certain stored data may be read and compared with a good copy of the data to determine the number of bad bits and thus the BER. This approach may be suitable for some cases where BER estimation from data shape is not suitable, for example, where bits are flipped in a substantially symmetric manner (the number of bits flipped from one to zero is approximately equal to the number of bits flipped from zero to one) so that bad bits do not affect overall data shape. The data may be a portion of test data that has a predetermined pattern that is easily reproduced so that a good copy can be generated whenever it is needed, for example all ones, all zeroes, alternating ones and zeroes, or some other simple pattern. FIG. 12 shows an example of test data in the top row. The test data consists of alternating ones and zeroes which can be easily generated. This test data may be stored in a memory and later read. For example, a portion of a memory may be considered as a test area that is not used for storage of user data but instead is used for test data. Such a test area may be included in each plane, in each block, or in some other arrangement, and may be static or may be relocated as desired. The test data is read from the memory as shown by the lower row. This may occur after the data has been stored for a significant period of time. The read copy is compared to a good copy to identify any flipped bits. In FIG. 12, one bit 160 flipped from zero to one. By counting all such bits in a portion of test data the BER may be obtained for the test data. The BER is then extrapolated to user data in the memory. For example, results from test data in a particular block, plane, or other unit, may be extrapolated to other data in the block, plane, or other unit. In general, extrapolation may simply mean assuming the same BER applies to user data in the same physical unit in the memory (i.e. if test data has BER=X then assume nearby user data also has BER=X). In some cases, due to the pattern of test data, location where test data is stored, or other factors, some adjustment may be made when extrapolating. For example, where test data and storage location represent a worst-case example, the BER in nearby user data may be lower than the BER of the test data.

One way to simply compare read test data with good test data is by performing an Exclusive OR (XOR) operation on the two portions of data. FIG. 13A shows an XOR gate 164 that may be implemented in any suitable manner. FIG. 13B is a truth table for the XOR gate 164 of FIG. 13A showing that the output (C) is zero when the inputs (A and B) are the same. The output is one only when inputs are different. FIG. 13C illustrates comparison by XORing of good test data (top row), read data (middle row), to provide an XOR output (bottom row) in which a one represents a flipped bit 168.

FIG. 14 illustrates how BER may be determined using test data. The test data is stored with user data 170. This may be done so that the test data experiences the same conditions as the user data. The test data may be stored at the same time as the user data, or shortly after, and may be stored at the same physical location, or a close physical location. The cells used to store such test data may be referred to as "reference cells" used for reference to estimate the BER of associated user data. For example, the test data may be in reference cells in the same page, block, or plane as the user data. In some cases, test data may be written in relatively small chunks that are smaller than units of writing of user data. For example, some ReRAM memories allow writing of relatively small portions of data that are smaller than a conventional page in flash memory. Such portions of data may be written separately or in parallel with writing of user data and may subsequently be read separately or in parallel with user data. In some cases, a portion of test data may be written whenever a new host write command is received so and that test data is then used to estimate the BER for data stored in response to the write command. In other examples, test data may be written in a block when writing of user data starts in the block. The test data may then be used to estimate the BER of data stored in the block. Subsequently, the test data is read from the memory 172. This may occur when user data is to be read (e.g. in response to a host read command) or as part of an internal memory operation (e.g. as part of a test of data quality, or prior to an internal data copy such as during garbage collection). The read test data is compared with a good copy of the data to determine the number of bad bits in the test data 174. The number of bad bits gives the BER of the test data. The BER of the test data is then extrapolated to user data 178.

Uses of BER

A BER estimate such as obtained from one of the techniques described above may be used to indicate the health of stored data and has several practical applications in memory operations. In general, knowing the BER of a particular portion of data allows that data to be handled in a manner that is appropriate. Data with a high BER may be handled differently to data with a low BER.

Figure 15:
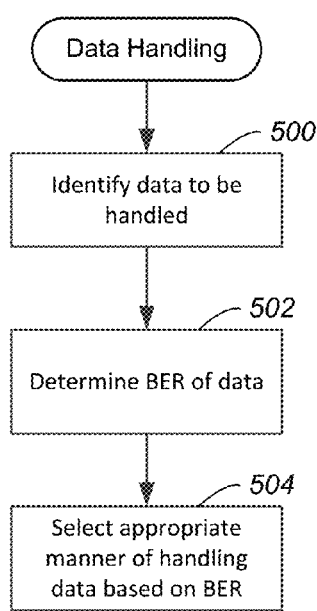
FIG. 15 shows an example of how BER data may be used.

FIG. 15 illustrates how BER estimation may be applied to data handling. Data to be handled is first identified 500. For example, a read command from a host may identify such data. In other cases, data may be identified by a memory controller as being due for some housekeeping operation such as garbage collection or scrubbing. The BER of the identified data is then estimated 502, for example by comparing the shape of the identified data prior to storage and after storage, or by comparing stored test data with a good copy of the test data, or otherwise. An appropriate manner of handling the data is then selected based on the BER of the data 504.

In some cases, the BER is stored so that the health is tracked over time in a table or other form. This allows mapping of data health across a memory (e.g. page-by-page, block-by-block, die-by-die, or in some other unit) over time. This may provide some information on the rate of decay of stored data which may give a rough estimate of how long the data may be expected to remain good. It may also help to identify blocks that are close to becoming bad blocks before they become unusable (thus avoiding any loss of user data). Periodic health checks may be performed on portions of the memory so that data health information remains up to date. This data may be used to determine how to prioritize refresh or scrub operations and how data should be read, copied, and decoded.

Figure 16:
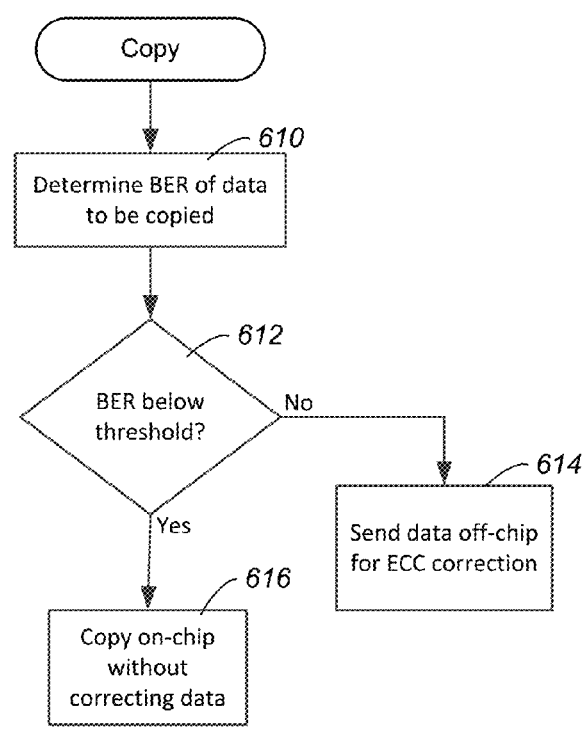
FIG. 16 shows how BER data may be used when performing copy operations.

FIG. 16 illustrates an example of how BER information may be used when copying data from one location in a memory to another as part of an internal copy operation. For example, such data may be copied to a new location during garbage collection or consolidation of valid data. The BER of the data to be copied is determined 610. If the BER is not below a threshold 612 then the data may be sent off-chip (e.g. to a memory controller) for ECC correction 614. The corrected data may be sent back to the memory for storage. If the BER is below the threshold 612 then the data may be copied to another location on the same memory chip without ECC correction 616. This provides a simple fast manner of copying data without using resources of the memory controller or using the memory bus between the memory and controller. In general, the threshold above which ECC correction is required depends on the ECC correction capacity available. It is generally desirable to perform ECC correction if there is a significant probability that the data, if copied without correction, would become uncorrectable by ECC (UECC) by the next time it is read. Thus, for example, where an ECC scheme can correct 10 bad bits per page, it may be considered acceptable to copy a page that contains 3 bad bits without ECC correction while it may be considered unacceptable to copy a page that contains 7 bad bits without ECC correction because such data is closer to becoming UECC.

Figure 17:
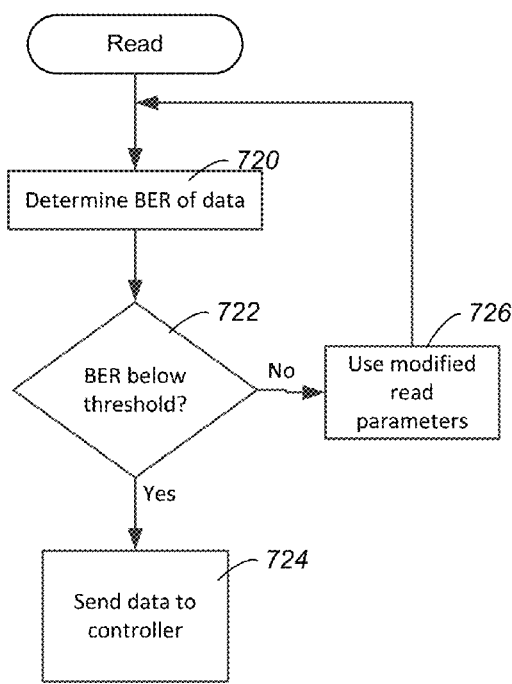
FIG. 17 shows how BER data may be used when performing read operations.

FIG. 17 illustrates an example of how BER information may be used when reading data from a memory. The BER of data to be read is determined 720. A determination is made as to whether the BER is below a threshold 722. If the BER is below the threshold then the data may be sent to a memory controller 724 where the data may be subject to ECC decoding (and may be sent on to a host after decoding). If the BER is not below the threshold 722 then the data may be reread using modified read parameters 726. For example, a different read voltage may be applied and/or different read pass voltages may be applied, or a higher resolution read operation may be used. The BER of the reread data is determined and compared with the threshold. This cycle may be repeated with different read conditions until data is read with a BER that is below the threshold. If suitable read conditions are found they may be recorded for subsequent read operations in the block or other unit. The operation may terminate if some maximum time, or maximum number of cycles, is reached without obtaining acceptable data.

In some cases an appropriate error correction scheme may be chosen according to the BER in the read data. For example, different ECC decoding approaches may be used depending on the BER estimated. Certain ECC engines support multiple decoding modes. In some cases, a simple fast mode may be applied if the BER is low and a more complex slower mode may be applied if the BER is higher. For example, an indication of a high BER may result in selection of an advanced ECC decoding mode, which may use more power and/or require more time. This may allow appropriate ECC decoding of data with different BERs so that relatively good data is decoded rapidly and efficiently, and more advanced ECC decoding is used sparingly for relatively bad (noisy but still correctable) data. Two or more ECC decoding modes or schemes may be applied to data according to estimated BER so that ECC decoding is tailored to the quality of a particular portion of data to be decoded. If the BER indicates that the data is UECC then ECC correction may be skipped in favor of recovering the data in some other manner, or some other approach may be used first to obtain correctable data which is then sent for ECC decoding. For example, a modified read scheme may be used to obtain correctable data which is then sent for ECC correction. This saves the significant resources that may be consumed attempting to correct UECC data. For example, Low Density Parity Check (LDPC) decoding may take significant time and resources.

Figure 18:
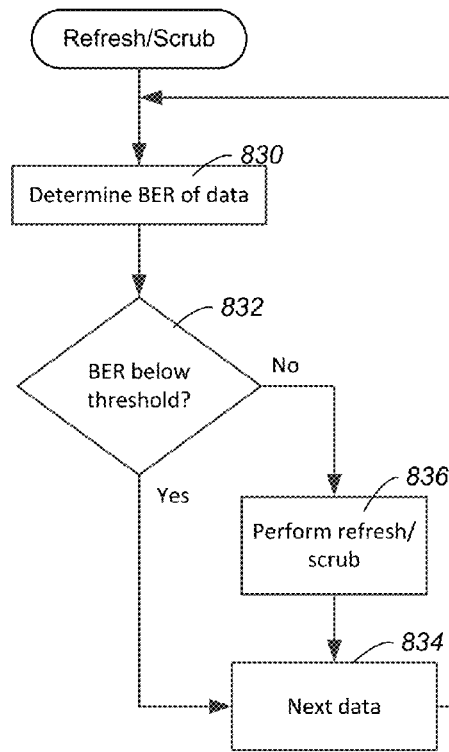
FIG. 18 shows how BER data may be used when performing refresh or scrub operations.

FIG. 18 illustrates an example of how BER information may be used when performing a refresh or scrub operation in a memory. In general, a refresh operation rewrites data into the same cells to improve the quality of the data while a scrub operation rewrites the data to another location in memory and makes the old copy obsolete thus allowing it to be erased. Certain ReRAM memories may be refreshed while many charge storage memories are scrubbed. In either case, the BER of the data may be determined 830. The BER is then compared with a threshold 832. If the BER is below the threshold then the operation may proceed to the next data 834 without performing refresh or scrub. Thus, if the BER indicates that the data is in good condition (e.g. not close to becoming UECC) then there may be little benefit to refreshing or scrubbing the data and therefore the data is left undisturbed. Only if the BER is not below the threshold (i.e. if BER indicates data is in poor condition, e.g. close to becoming UECC) then a refresh or scrub operation is performed 836 on the data.

Figure 19:
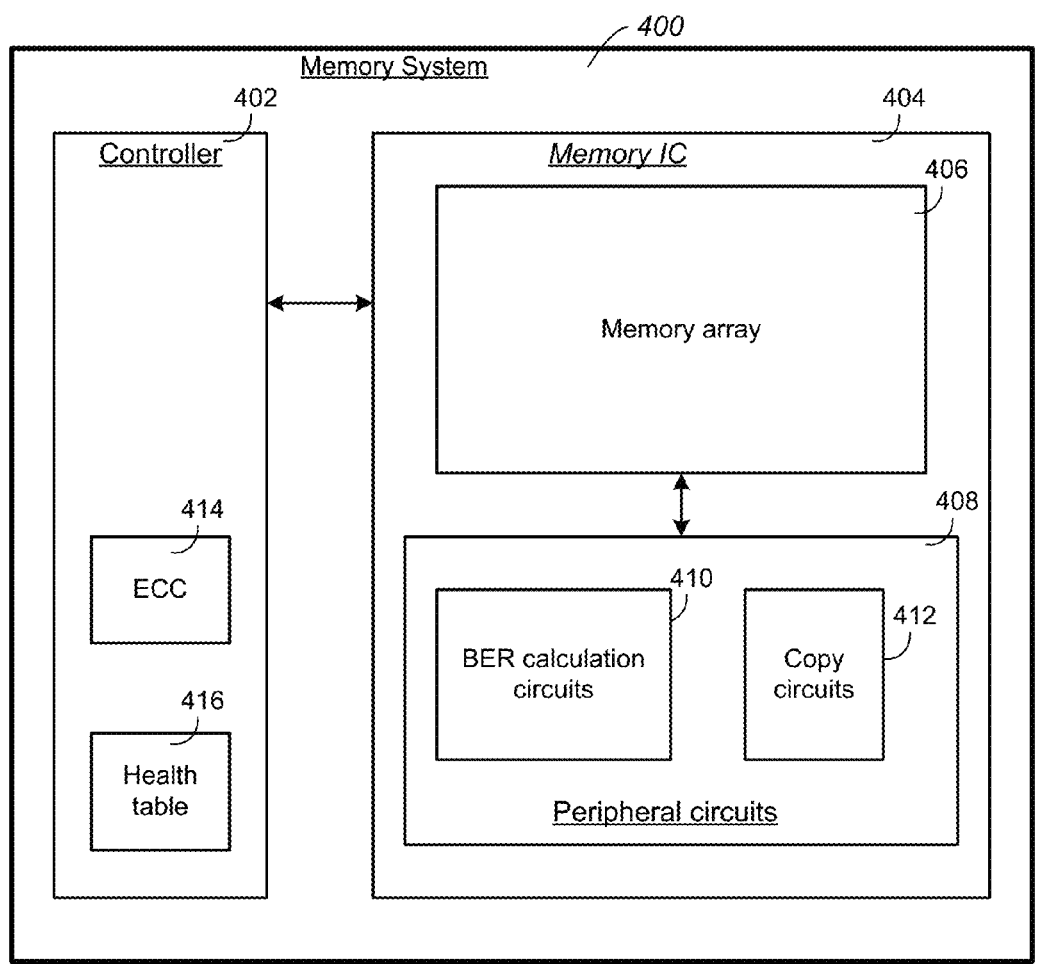
FIG. 19 shows an example of memory system hardware.

FIG. 19 illustrates an example of hardware that may be used to implement some of the techniques described above. A memory system 400 includes a memory controller 402 and a memory integrated circuit (IC) 404 connected by a memory bus. Additional memory ICs may also be connected to the memory controller by the bus and/or by additional busses. The memory IC 404 includes a memory array 406, which may be a two dimensional (planar) memory array or a three dimensional memory array with multiple physical levels disposed above a substrate. The memory may store two bits per cell (SLC) or may store more than two bits per cell (MLC) and may use charge storage, electrical resistance, or other physical property. The memory IC includes peripheral circuits 408 including BER calculation circuits 410 that may include circuits that record the shapes of data prior to storage and after storage and calculate BER from the difference between these shapes. These circuits may include bit scan circuits that count the number of bits of a particular logic state (e.g. logic 0). BER calculation circuits 410 may include XOR circuits that compare test data read from the memory array with a good copy of test data to determine the number of bad bits. Copy circuits 412 in the memory IC 404 allow on-chip copy to be performed (i.e. allow copying of data from one location in the memory array to another location in the memory array without sending the data outside the memory IC 404). Copy circuits may include one or more rows of data latches that can receive data from the memory, hold the data, and then transfer the data for programming. Memory controller 402 includes ECC circuits 414 such as LDPC circuits for encoding data prior to storage and decoding data after storage. Controller 402 also contains a table 416 that records the health of data in memory array 406 based on BER of the data. The table may record BER, or a metric derived from BER, for each page, block, or some other unit. The table may be updated as appropriate.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of determining an error rate for data stored in a nonvolatile memory array comprising:
   programming a population of memory cells to a plurality of states;
   recording an indicator of the number of the memory cells programmed to a first state of the plurality of states;
   subsequently performing a read operation to determine the number of the memory cells that are read as being in the first state;
   determining a difference between the number of the memory cells programmed to the first state and the number of the memory cells that are read as being in the first state; and
   calculating the error rate for data in the population of memory cells from the difference.

2. The method of claim 1 further comprising recording at least an additional indicator of the number of the memory cells programmed to a second state of the plurality of states.

3. The method of claim 1 further comprising: prior to programming the population of memory cells to the plurality of states, shaping raw data so that the data stored in the nonvolatile memory array is distributed across the plurality of states in a distribution that is different to the raw data.

4. The method of claim 1 wherein the error rate is calculated using a probability of memory cell transitions from the first state to at least one other state, and a probability of memory cell transitions from the at least one other state to the first state.

5. The method of claim 4 wherein the error rate is calculated using probabilities of transitions from each state of the plurality of states to each other state of the plurality of states.

6. The method of claim 1 wherein the indicator is one of: the number of the memory cells programmed to the first state; the number of the memory cells not programmed to the first state; the fraction of the memory cells programmed to the first state; or the fraction of the memory cells not programmed to the first state.

7. The method of claim 6 further comprising recording at least one additional indicator of the numbers of memory cells programmed to at least one additional memory state of the plurality of memory states.

8. The method of claim 1 further comprising:
   selecting an appropriate manner of handling the data in the population of memory cells according to the calculated error rate.

9. The method of claim 8 wherein the selecting includes selecting an on-chip copying of the data without Error Correction Code (ECC) correction when the calculated error rate is below a predetermined threshold.

10. The method of claim 8 wherein the selecting includes selecting an appropriate ECC scheme, or no ECC scheme, according to the calculated error rate.

11. The method of claim 10 wherein the selecting includes selecting an alternative to ECC correction of the data when the calculated error rate indicates that the data is uncorrectable using ECC.

12. The method of claim 10 wherein the selecting includes selecting a first ECC scheme for data with a first calculated error rate and selecting a second ECC scheme for data with a second calculated error rate that is higher than the first error rate, the first ECC scheme requiring less power and/or time than the second ECC scheme.

13. The method of claim 11 wherein the alternative includes rereading the data using a modified reading scheme that uses a modified read threshold voltage based on the calculated error rate.

14. The method of claim 13 wherein the modified reading scheme is a high resolution reading scheme that provides higher resolution than the read operation.

15. The method of claim 8 wherein the selecting includes updating a data management table to reflect the status of the data and additional data that is stored with the data based on the bit error rate.

16. The method of claim 8 wherein the selecting includes selecting a fast read scheme for the data and adjacent data in response to determining that the bit error rate is below a predetermined rate.

17. The method of claim 8 wherein selecting an appropriate manner of handling the data includes determining whether to perform data refresh or data scrub operations on the data.

18. The method of claim 1 wherein the calculating is performed by circuits on the same memory chip as the nonvolatile memory array.

19. A method of determining an error rate for data that is read from a nonvolatile memory array comprising:
programming a sample population of memory cells with test data;
subsequently reading the sample population of memory cells to obtain read data;
comparing the read data and the test data to identify a number of bad bits in the read data;
calculating a bit error rate for the sample population from the number of bad bits in the sample population; and
selecting a data handling scheme for user data stored in memory cells outside the sample population according to the bit error rate.

20. The method of claim 19 wherein the number of bad bits in the read data includes approximately equal numbers of bits flipped between two states.

21. The method of claim 19 wherein the sample population of memory cells consists of a number of memory cells that is fewer than the number of memory cells that are read when performing a read of user data, and wherein the reading of the sample population of memory cells is performed more rapidly than a read of user data.

22. The method of claim 21 further comprising selecting an appropriate ECC decoding scheme, or no ECC decoding scheme, for the user data according to the bit error rate.

23. The method of claim 22 wherein on-chip copy without ECC correction is selected when the user data is to be copied to another location in the nonvolatile memory array and the bit error rate is below a predetermined threshold.

24. The method of claim 22 wherein an alternative to ECC decoding is selected when the bit error rate indicates that the data is uncorrectable by ECC.

25. The method of claim 24 wherein the alternative includes rereading the data using modified read parameters.

26. The method of claim 19 further comprising making a determination as to whether to perform data refresh or data scrub operations on the user data based on the bit error rate.

27. A memory integrated circuit comprising:
an array of memory cells formed on a substrate;
an error rate calculation circuit on the substrate, the error rate calculation circuit configured to receive a portion of data that is read from the array of memory cells and perform an error rate calculation on the portion of data read from the array of memory cells; and
wherein the error rate calculation circuit includes a scan circuit for counting the number of bits in a particular state in the portion of data that is read from the array of memory cells.

28. The memory integrated circuit of claim 27 wherein the array of memory cells is a monolithic three dimensional memory array formed in a plurality of memory device levels vertically disposed above the substrate.

29. The memory integrated circuit of claim 28 wherein the array of memory cells is an array of Resistive Random Access Memory (ReRAM) cells.

30. The memory integrated circuit of claim 27 further comprising on-chip copy circuits, the on-chip copy circuits configured to copy the portion of data from a first location in the array of memory cells to a second location in the array of memory cells without transferring the portion of data outside the memory integrated circuit if the portion of data has a calculated error rate that is below a threshold.

31. The memory integrated circuit of claim 27 wherein the error rate calculation circuit includes an Exclusive OR (XOR) circuit for identifying bad bits in the portion of data that is read from the array of memory cells by performing an XOR operation with a good copy of the portion of data.

* * * * *